United States Patent
Chou et al.

(10) Patent No.: US 7,535,256 B2
(45) Date of Patent: May 19, 2009

(54) CROSS-LEVEL DIGITAL SIGNAL TRANSMISSION DEVICE

(75) Inventors: Yuh-Fwu Chou, Hsinchu (TW);
Tshaw-Chuang Chen, Hsinchu (TW);
Po-Yin Tseng, Miaoli (TW);
Kuo-Kuang Peng, Hsinchu (TW);
Mei-Fang Huang, Hsinchu (TW);
Ho-Yin Pun, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 1288 days.

(21) Appl. No.: 10/653,168

(22) Filed: Sep. 3, 2003

(65) Prior Publication Data
US 2005/0100046 A1     May 12, 2005

(30) Foreign Application Priority Data
Jan. 2, 2003  (TW) ............................ 92100037 A

(51) Int. Cl.
*H03K 19/094* (2006.01)

(52) U.S. Cl. .............................. 326/81; 326/86; 326/56
(58) Field of Classification Search .................. 326/21, 326/30, 56–59, 62–82; 327/201–218, 333
See application file for complete search history.

(56) References Cited

U.S. PATENT DOCUMENTS

| | | | | |
|---|---|---|---|---|
| 5,214,330 A | * | 5/1993 | Okazaki | 326/90 |
| 5,715,405 A | * | 2/1998 | McClear et al. | 710/100 |
| 6,046,605 A | * | 4/2000 | Ziemkowski et al. | 326/86 |
| 6,724,224 B1 | * | 4/2004 | Li | 326/82 |
| 6,822,480 B1 | * | 11/2004 | McCalmont | 326/81 |

* cited by examiner

*Primary Examiner*—James H. Cho
*Assistant Examiner*—Jany Tran
(74) *Attorney, Agent, or Firm*—Birch, Stewart, Kolasch & Birch, LLP

(57) ABSTRACT

A cross-level digital signal transmission device between two systems for cross-level digital signal transmission. Bi-directional symmetrical transmission is achieved without using additional control signals, and use of the transmission signal itself eliminates the positive feedback loop. Thus, neither additional control signals nor resulting unsymmetrical circuits need be provided.

8 Claims, 11 Drawing Sheets

CROSS-LEVEL DIGITAL SIGNAL TRANSMISSION DEVICE

This nonprovisional application claims priority under 35 U.S.C. § 119(a) on Patent Application No. 092100037 filed in Taiwan on Jan. 2, 2003, which is herein incorporated by reference.

BACKGROUND OF THE INVENTION

1. Field of the Invention

The present invention relates to a device for cross-level digital signal transmission. In particular, the present invention relates to a device capable for transforming voltage levels of digital signals.

2. Description of the Prior Art

A battery state monitoring circuit of a battery module management system comprises a battery monitoring chip capable of outputting digital data. Because additional series of battery units are used in applications requiring more power, a single battery monitoring chip cannot monitor the voltage or temperature of each battery. More battery monitoring chips are required to correspondingly monitor the state of related batteries. In addition, it is necessary to use a central control microprocessor to acquire status of all the batteries in some complicated battery management functions. Because of the different electrical ground levels in each battery monitoring chip, these chips have problems transmitting battery status data to the central control microprocessor.

In general, a serial data transmission interface standard of a bi-directional signal line is designed according to requirements of communication between a first digital system 1 and a second digital system 2, both connected to the same ground. The connection between the first digital system 1 and the second digital system 2 is shown in FIG. 1, wherein the output stages of both systems are open-collector NPN transistor (101 and 102). The first digital system 1 includes an input unit 501 and output unit 502, and the second digital system 2 includes an input unit 503 and output unit 504. When any one of systems does not transmit data, transistors 101 and 102 are turned off, and a voltage level of a transmission line is H through a voltage source $V_{cc}$ and a pull-up resistor $R_{pull-up}$. When one of the two systems transmits data, the transistor of this system is open, and the voltage level of the transmission line is L. However, if there is a voltage difference $V_{diff}$ in ground level between two systems, the digital signal transmitted between the two systems is in error. As shown in FIG. 2, voltage $V_{g1}$ is the ground level in the first digital system 1, and $V_{g2}$ is the ground level in the second digital system 2. Here, $V_{g2}=V_{g1}+V_{diff}$ and $V_{diff}>V_{cc}$. When the voltage difference between two systems is greater than the pull-up voltage of the pull-up resistor $R_{pull-up}$, the logic level of the signal transmitted to the second digital system 2 from the first digital system 1 is regarded as L, and the logic level of signal transmitted to the first digital system 1 from the second digital system 2 is regarded as H. It is thus unable to transmit correct signals. Here, the labels L and H represent low voltage and high voltage levels, respectively.

As a result, a general solution is to add a control line to either the first digital system 1 or the second digital system 2, which transmits data, to control the direction of data transmission. As shown in FIG. 3, a first logic level converter 3 and a second logic level converter 4 comprise signal control terminals 103 and 104, respectively. The first logic converter 3 is a cross-level buffer to shift digital signal from a low voltage system to a high voltage system, and the logic level converter 4 is a cross-level buffer to shift digital signal from a high voltage system to a low voltage system. Thus, connection of an input and output between the first logic level converter 3 and second logic level converter 4 forms a positive feedback. If signal control terminals 103 and 104 do not turn off one of the two systems, the locking data property will hinder transmission. Thus, another control signal is required to determine allowed data direction at any time, as the T/R signal in FIG. 3, and then data of two systems can transmit effectively. The above-mentioned solution does not, however, solve the problems described in FIG. 2 completely. For example, first, it is necessary to generate the added control signal by a certain circuit function block or programming control circuit, such that the circuit becomes more complex; second, the symmetry of the two systems signal is affected. In FIG. 3, the first digital system 1 must set the data direction as a correct direction when the second digital system 2 starts to transmit data, and the data can reach the first digital system.

SUMMARY OF THE INVENTION

An object of the present invention is to provide a circuit for a cross-level digital signal transmission between two systems and ensuring bi-directional symmetrical transmission without a need for additional control signals. The main feature of this invention is use of the transmission signal itself to cut off the positive feedback loop. Thus, it is unnecessary to provide additional control signals. And the bi-directional transmission circuitry remains symmetrical.

To achieve the above-mentioned purpose, the present invention provides a cross-level digital signal transmission device, coupled between a first digital system and a second digital system having different ground level and different voltage level of high logic level and low logic level. The invention comprises of the following items.

The first gateway device has a first signal control terminal for conversion of a logic level of a first signal from the first digital system and transmission to the second digital system.

The second gateway device has a second signal control terminal for conversion of a logic level of a second signal from the second digital system and transmission to the first digital system. The first gateway device 6 and the second gateway device connect in parallel and form a closed loop.

Please note that, the first gateway device controls the second signal control terminal when the first digital system transmits the first signal to prevent the first signal from transmitting to the first digital system by the second gateway device. Also, the second gateway device controls the first signal control terminal when the second digital system transmits the second signal to prevent the second signal from transmitting to the second digital system by the first gateway device.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
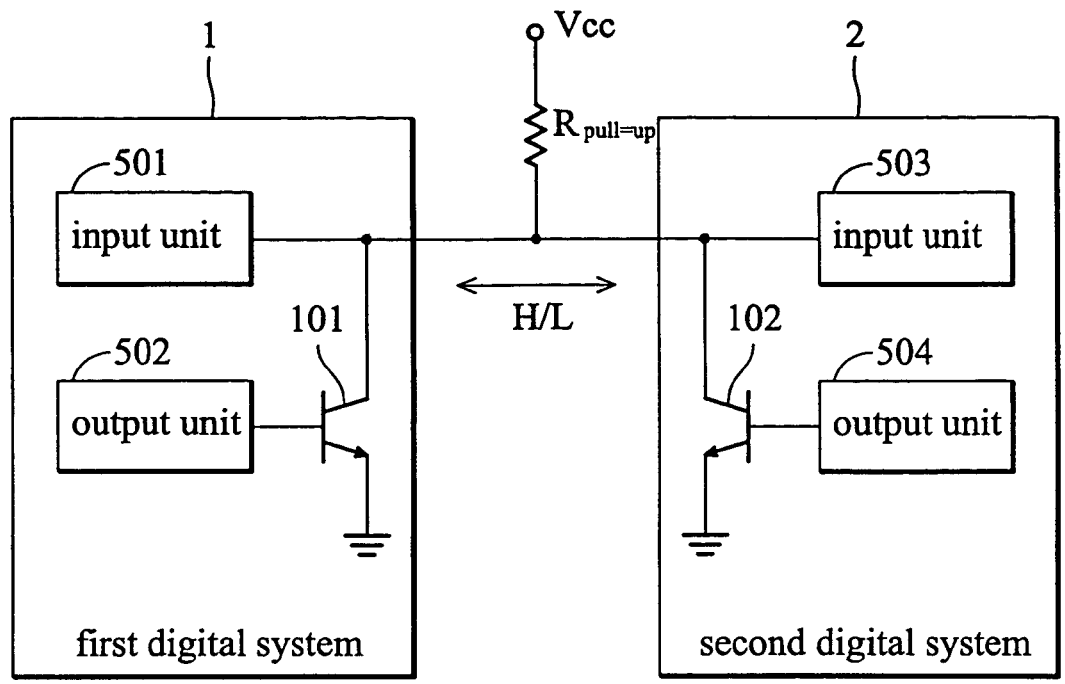
FIG. 1 shows the architecture of a serial data transmission interface of a bi-directional signal line wherein both directions are connected to the same ground.
Figure 2:
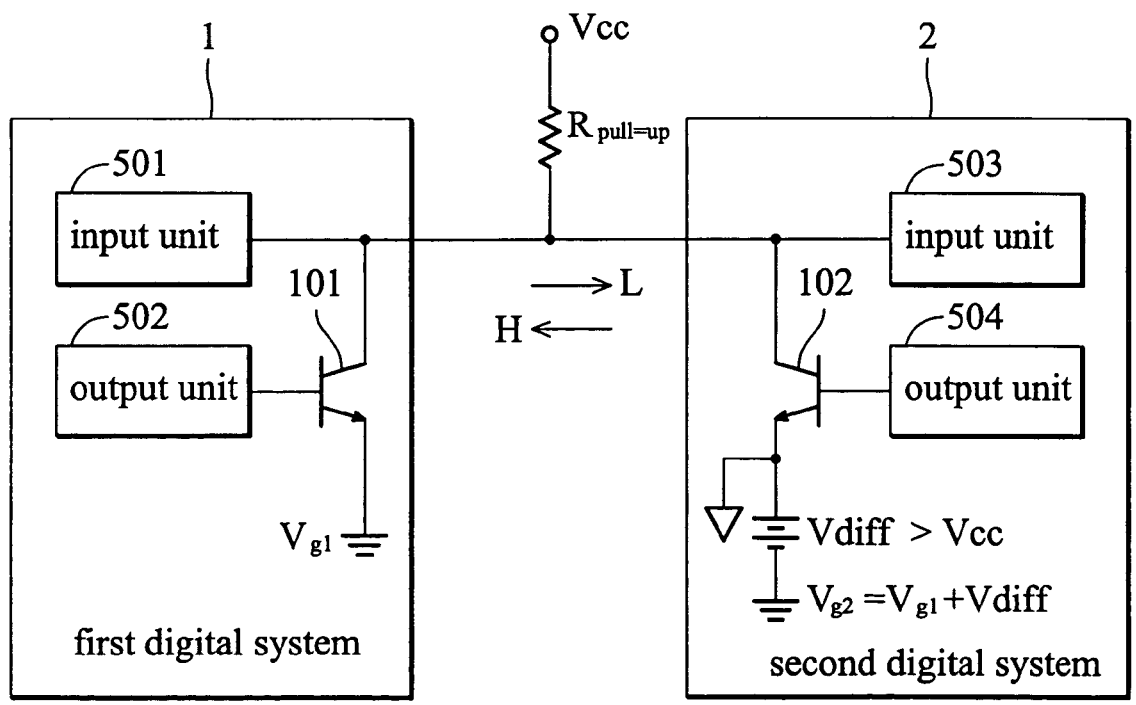
FIG. 2 shows the architecture of the circuit having a ground voltage difference.
Figure 3:
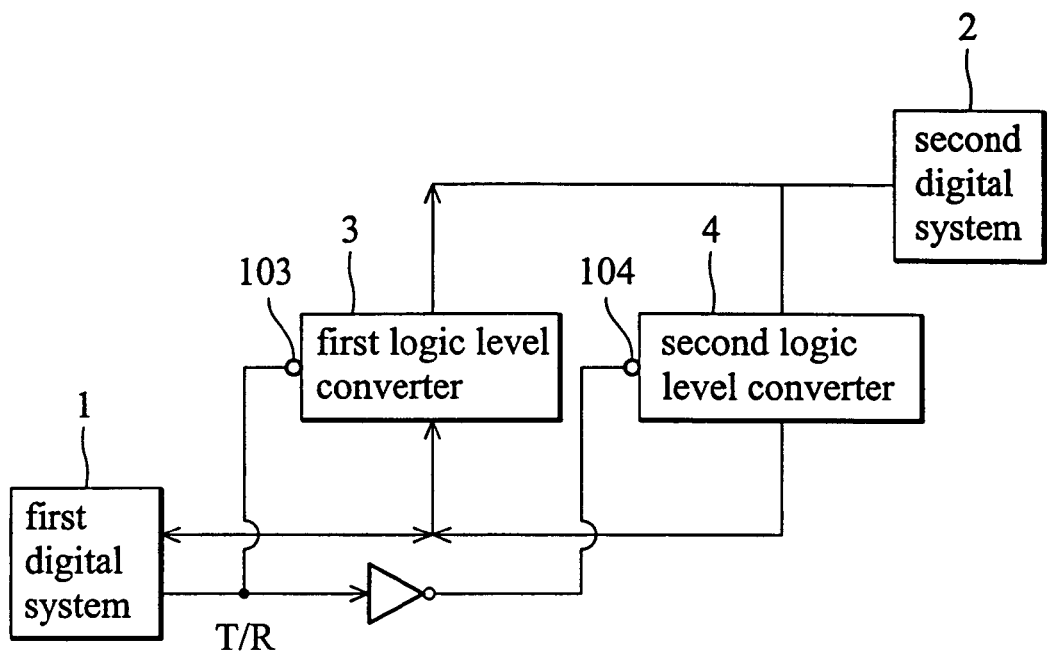
FIG. 3 shows an architecture of the conventional logic level converter having two signal control terminals.
Figure 4:
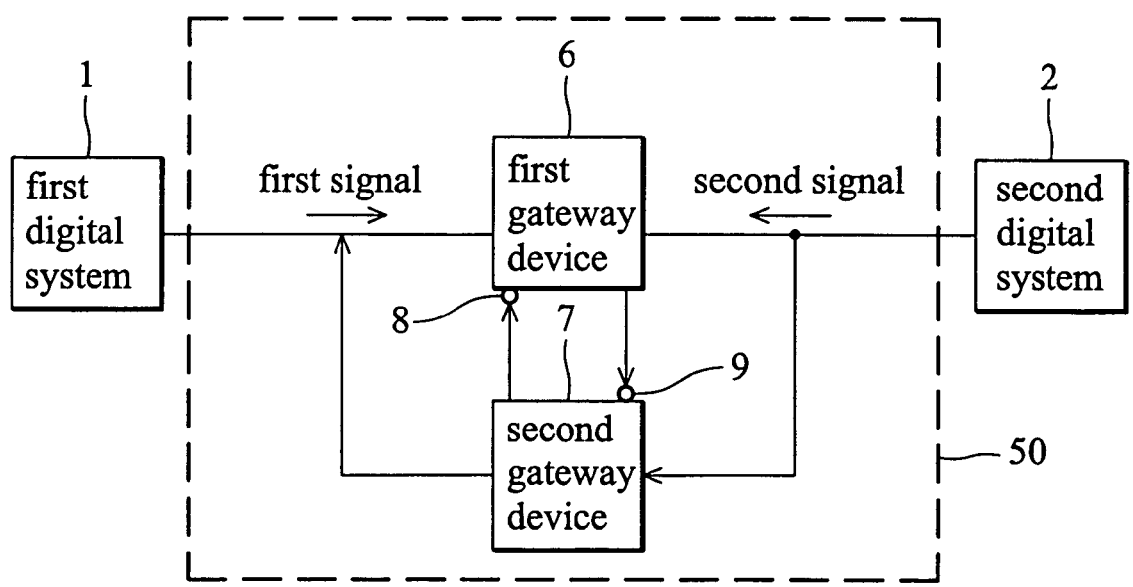
FIG. 4 shows an architecture of the present invention having digital signal level converter 50 between two systems.

FIG. 4 shows the architecture of the present invention having a digital signal level converter 50 between two digital systems. The signal level converter 50 is between the first digital system 1 and the second digital system 2. The first digital system 1 and the second digital system 2 have different voltage levels in logic 0 (herein low level) and logic 1 (herein high level), with ground level of two systems are different, preferably.

The digital signal level converter 50 comprises a first gateway device 6 and a second gateway device 7. The first gateway device 6 comprising a first signal control terminal 8 receives a first signal from the first digital system 1 to convert the logic level of the first signal, and is then output to the second digital system 2. The second gateway device 7 comprising a second signal control terminal 9 receives a second signal from the second digital system 2 to convert the logic level of the second signal, and is then output to the first digital system 1. The first gateway device 6 and the second gateway device 7 are connected in parallel and form a closed loop. The first gateway device 6 controls the second signal control terminal 9 of the second gateway device 7 at the same time that the first digital system 1 transmits the first signal. Thus, the second gateway device 7 cannot transmit the first signal, whose voltage level has been converted, back to the first digital system 1 to avoid the closed loop being locked in the logic state of the first signal. In addition, the second gateway device 7 controls the first signal control terminal 8 of the first gateway device 6 at the same time that the second digital system 2 transmits the second signal. Thus, the first gateway device 6 cannot transmit the second signal, whose voltage level has been converted, to the second digital system 2 to avoid the closed loop being locked in the logic state of the second signal.

In FIG. 4, when any one of output signals of two systems is at low logic level, the signal is transmitted to another system, and the first signal control terminal 8 or the second signal control terminal 9 is turned off. It can avoid the loop being locked_in the state of low-input and low-output, and the system of outputting the low logic level signal can transmit data to the other system. After transmission of the data is finished, the logic level, which was a low logic level, becomes a high logic level, and the data channel permits the other system to transmit data to confirm. Because this circuit is based on symmetry, there is no problem of master control between the systems.

Figure 5:
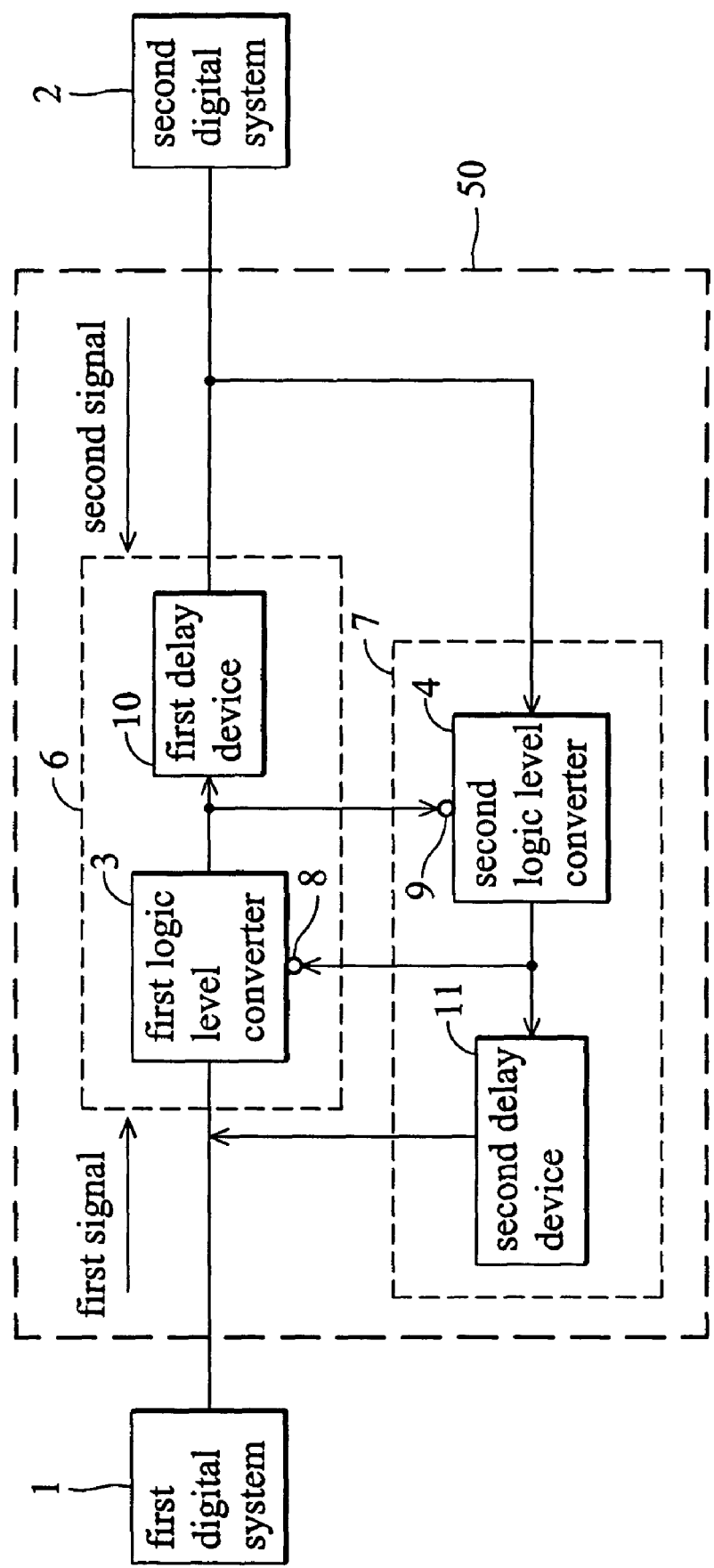
FIG. 5 shows an architecture of one embodiment of the present invention.

As shown in FIGS. 4 and 5, the first gateway device 6 comprises a first logic level converter 3 and a first delay device 10, and the second gateway device 7 comprises a second logic level converter 4 and a second delay device 11.

The first logic level converter 3, having the first signal control terminal 8 receives the first signal and converts the logic level of the first signal to conform to the logic level definition of the second digital system 2. The first delay device 10 is located between the output terminal of the first logic level converter 3 and the second digital system 2.

The second logic level converter 4, having the second signal control terminal 9, receives the second signal and converts the logic level of the second signal to conform to the logic level definition of the first digital system 1. The second delay device 11 is located between the output terminal of the second logic level converter 4 and the first digital system 1.

It is noted that the first signal control terminal 8 is connected to the output terminal of the second logic level converter 4, and the second signal control terminal 9 is connected to the output terminal of the first logic level converter 3. The first delay device 10 must delay output of the output signal of the first logic level converter 3 until the first logic level converter 3 turn off the second logic level converter 4 by the second signal control terminal 9. Also, the second delay device 11 must delay output of the output signal of the second logic level converter 4 until the second logic level converter 4 turn off the first logic level converter 3 by the first signal control terminal 8.

Figure 6:
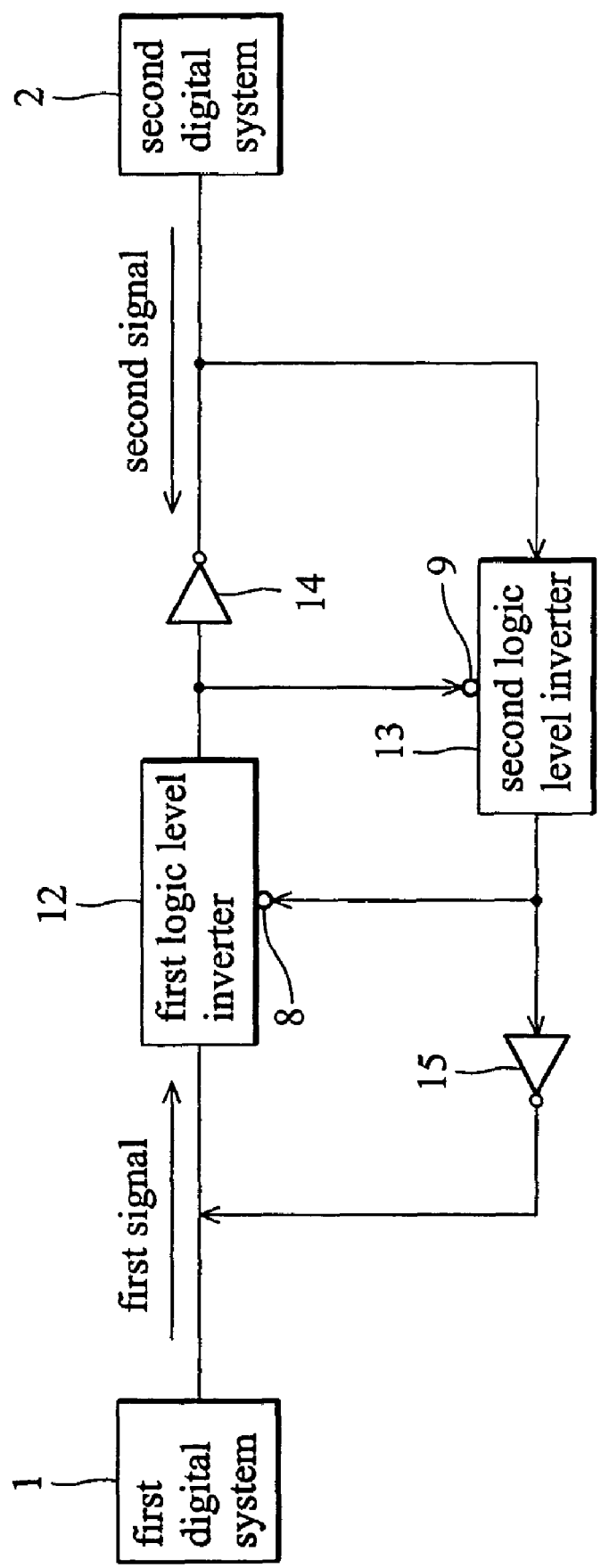
FIG. 6 shows an architecture of another embodiment of the present invention.

Referring to FIGS. 5 and 6, the first logic level converter 3 and the second logic level converter 4 in FIG. 5 respectively comprise the first logic level inverter 12 and the second logic level inverter 13, in FIG. 6. In addition, the first logic level inverter 12 and the second logic level inverter 13, with an inverse function, each have a signal control terminal. The first delay device 10 and the second delay device 11 are composed of the first inverter 14 and the second inverter 15. As shown in FIG. 6, the logic level of the signal input to the first logic level inverter 12 is the same as that of the signal output from the first inverter 14. Similarly, the logic level of the signal input to the second logic level inverter 13 is the same as that of the signal output from the second inverter 15. Particularly, the first inverter 14 and the second inverter 15 delay the transmission of the signal.

Figure 7:
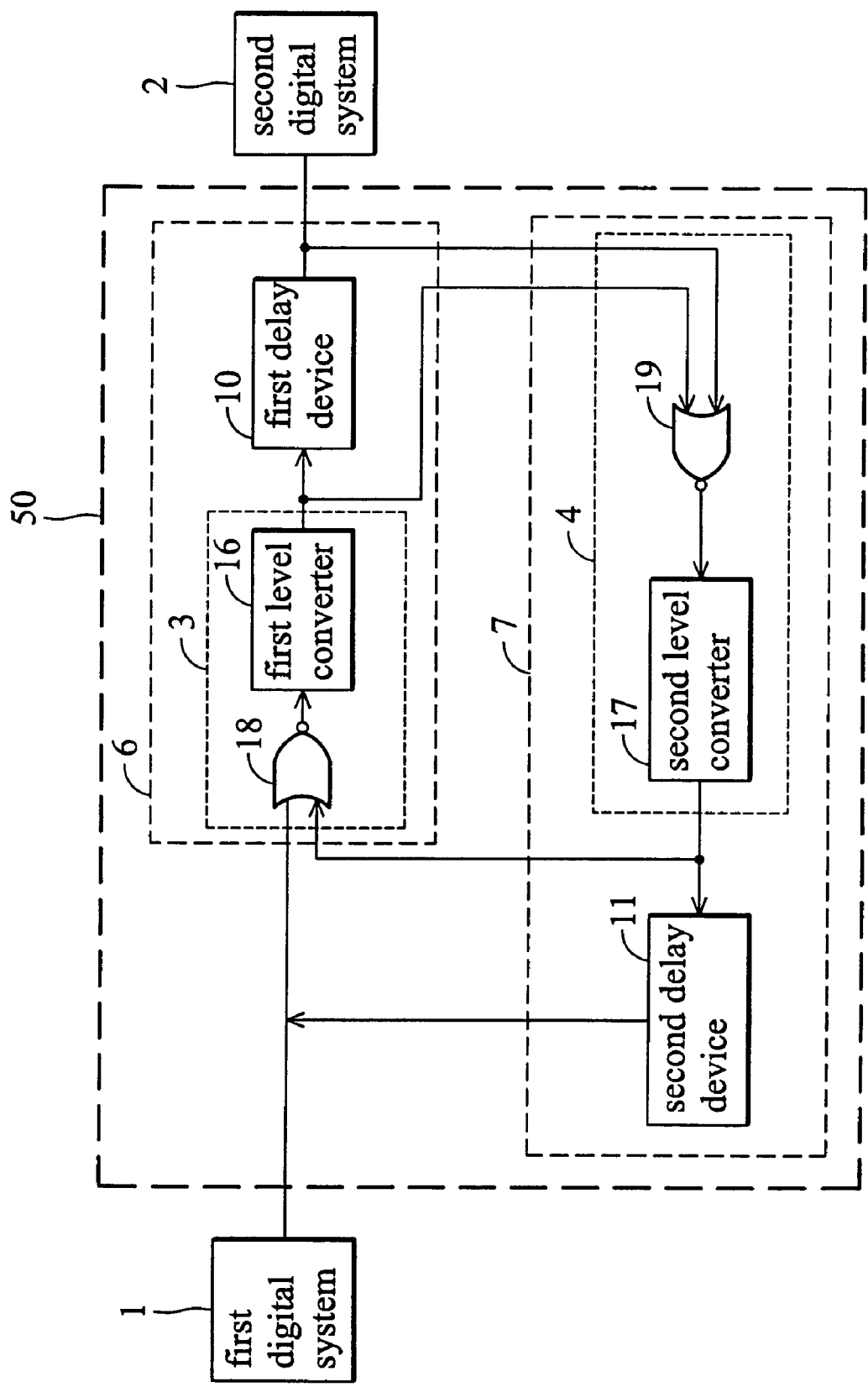
FIG. 7 shows a block diagram of yet another embodiment of the present invention.

Moreover, the first logic level converter 3 and the second logic level converter 4 in FIG. 5 can be implemented by a logic gate and a logic level converter to the function. In FIG. 7, the first logic level converter 3 comprises a first NOR gate 18 with two input terminals and a first level converter 16. One input terminal of the first NOR gate 18 is connected to the first digital system 1, and the other is regarded as the first signal control terminal 8. The first level converter 16 is located between the output of the first NOR gate 18 and the input of the first delay device 10 for converting the digital level of the first signal. In addition, the second logic level converter 4 comprises a second NOR gate 19 with two input terminals and a second level converter 17. One of the input terminal of the second NOR gate 19 is connected to the second digital system 2, and the other is regarded as the second signal control terminal 9. The second level converter 17 is located between the output of the second NOR gate 19 and the input of the second delay device 11 for converting the digital level of the second signal. In the embodiment of FIG. 7, inverters can act as the first delay device 10 and the second delay device 11.

Referring now to FIG. 7, when the first digital system 1 and the second digital system 2 are in the receiving state (the logic level of output is high), either of the two systems can transmit a low logic level to the other. At the same time, both the first level converter 16 and the second level converter 17 output low digital level signals. When the output signal of the first digital system 1 is a low digital level and is transmitted to the second digital system 2, the output signal of the first NOR gate 18 becomes a high digital level. Then, the first level converter 16 converts the output signal of the first NOR gate 18 to conform to the logic level definition of the second digital system 2 and still outputs a high digital level. Because the output of the first level converter 16 is a high digital level, the output of the second NOR gate 19 maintains a low digital level, and the output signal of the first delay device 10 cannot transmit to the first digital system 1 after being provided for the second digital system 2. As a result, the output signal of the second level converter 17 is still a low logic level, and the output signal of the first NOR gate 18 is determined by the output definition of the first digital system. Then, the loop comprising the first gateway device 6 and the second gateway device 7 cannot be locked in the specific logic level. Thus the second digital system 2 transmits to the first digital system 1.

Using the digital signal level converter of the present invention, the first digital system 1 and the second digital system 2 can transmit low logic level signals to each other, and the signal level transmitted from the inverse logic level converter is not affected.

Figure 8A:
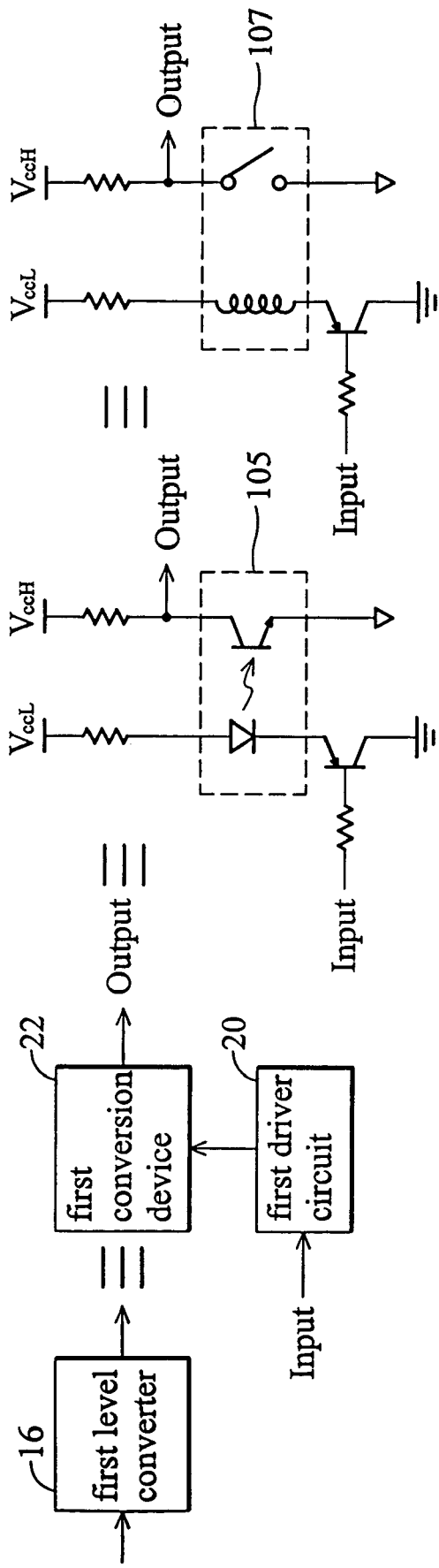
FIGS. 8A and 8B show one embodied circuit of the first and second level converters of the prevent invention.
Figure 8B:
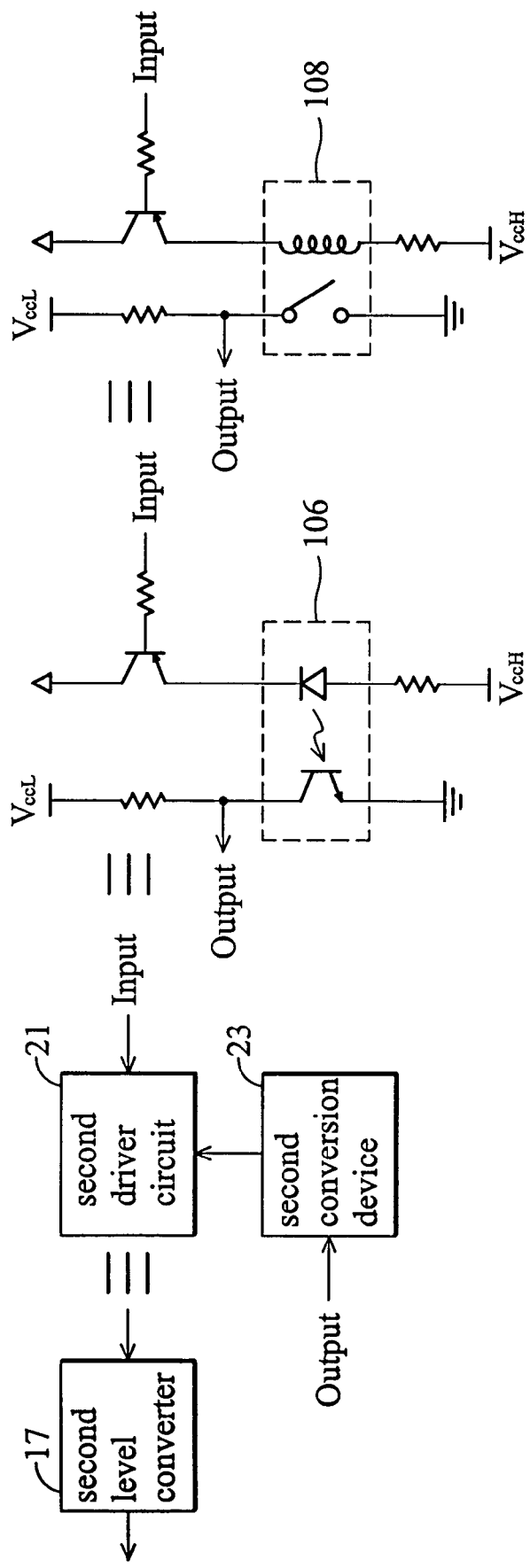

FIGS. 8A and 8B show one way to provide the first level converter 16 and the second level converter 17. The first level converter 16 comprises a first driver circuit 20 and a first conversion device 22. The input terminal of the first driver circuit 20 is connected to the output terminal of the first NOR gate 18. The input terminal and the output terminal of the first conversion device 22 are connected to the output terminal of the first driver circuit 20 and the input terminal of the first delay device 10, respectively.

The second level converter 17 comprises a second driver circuit 21 and a second conversion device 23. The input terminal of the second driver circuit 21 is connected to the output terminal of the second NOR gate 19. The input terminal and the output terminal of the second conversion device 23 are connected to the output terminal of the second driver circuit 21 and the input terminal of the second delay device 11, respectively.

In the embodiment shown in FIGS. 8A and 8B, the first conversion device 22 and the second conversion device 23 comprise photocoupled devices 105 and 106 having isolating function and corresponding resistors. Switches comprise the first conversion device 22 and the second conversion device 23, as a PNP bipolar transistor switch and a corresponding resistor. In order to achieve isolation, relays 107 and 108 can replace the photocoupled devices.

If the first digital system 1 has a lower ground level, the first level converter 16 comprising the photocoupled device 105 has the function of up-shift data level transmission. The second level converter 17 comprising the photocoupled device 106 has the function of down-shift data level transmission. The power source $V_{CCL}$ is smaller than power source $V_{CCH}$.

Figure 10A:
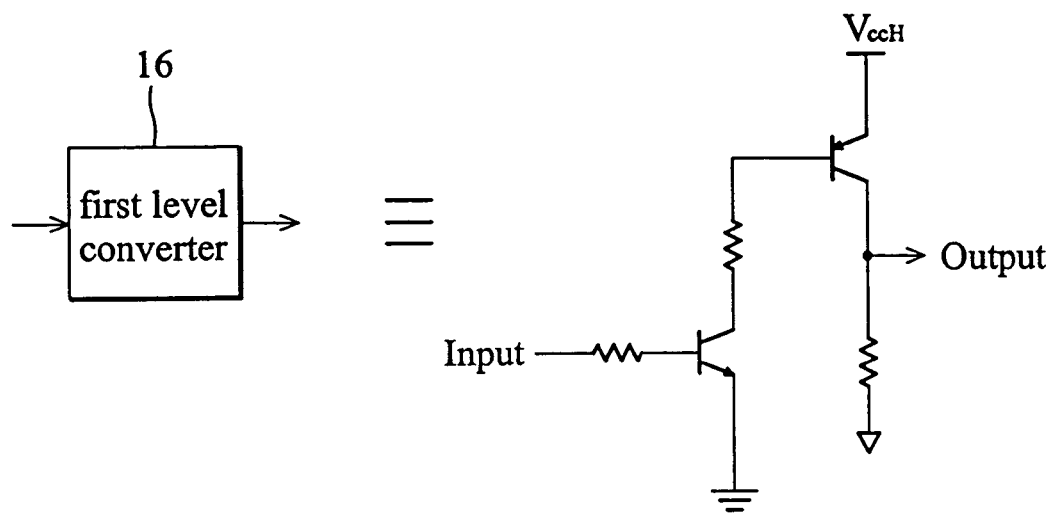
FIGS. 10A and 10B show another embodied circuit of the first and second level converters of the present invention.
Figure 10B:
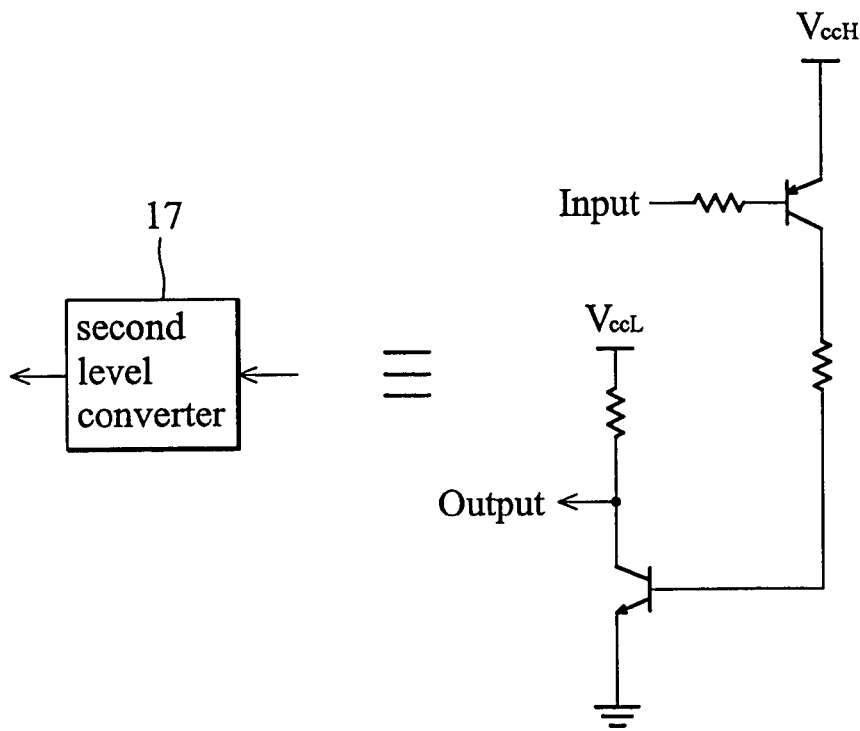

In addition, the voltage shifters comprising transistors shown in FIGS. 10A and 10B can act as the first level converter 16 and the second level converter 17 in FIG. 7.

In FIGS. 10A and 10B, although the transistors of voltage shifters do not have separating function, the function of logic level converter can be obtained, as the bipolar junction transistor disclosed here. The voltage shifter in FIG. 10A has the function of up-shift data level transmission and the voltage shifter in FIG. 10B has the function of down-shift data level transmission.

Figure 11:
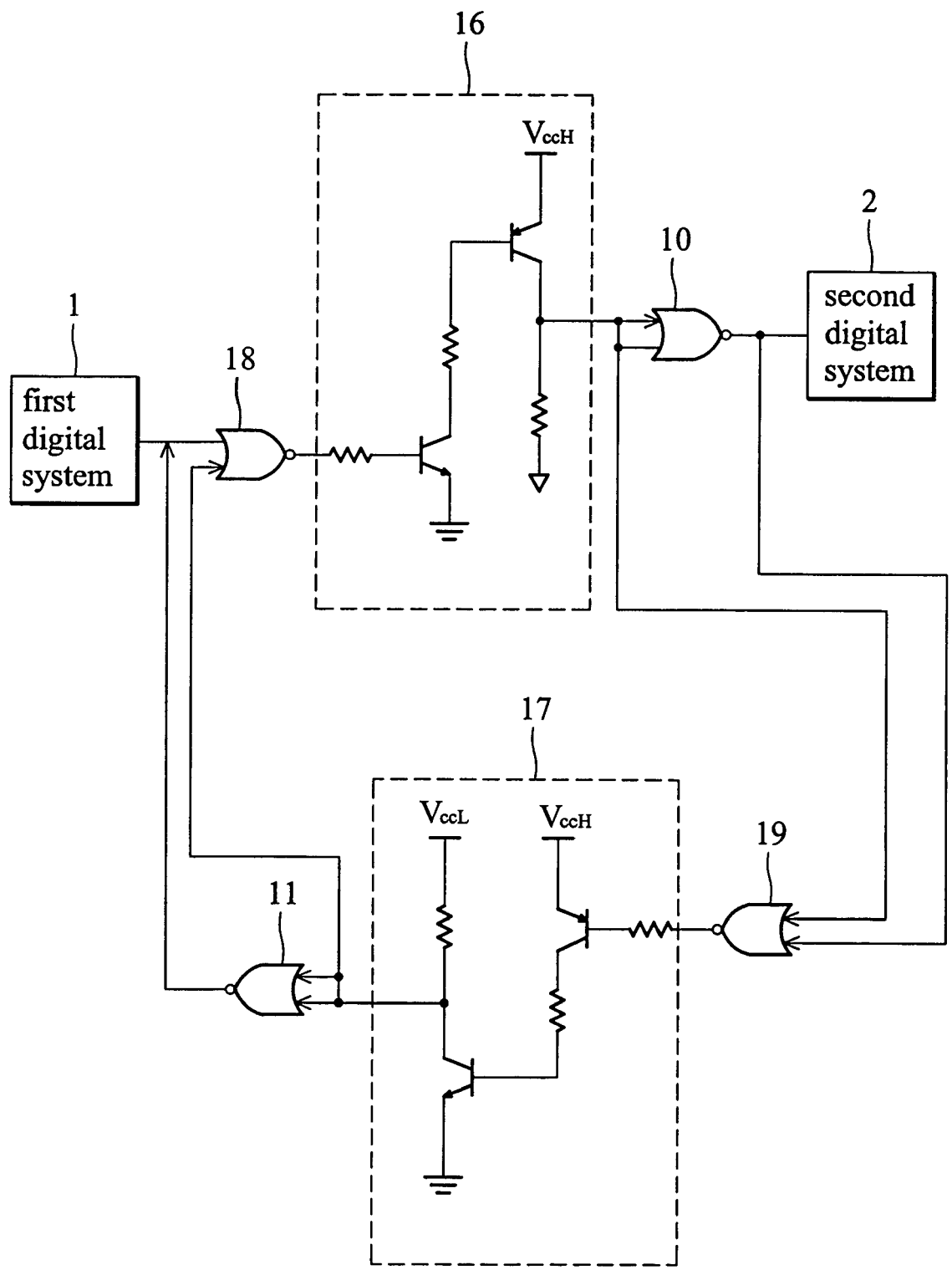
FIG. 11 shows another possible circuit diagram to implement the prevent invention.

FIG. 11 shows the circuit in FIG. 5 with photocoupled devices.

Figure 9:
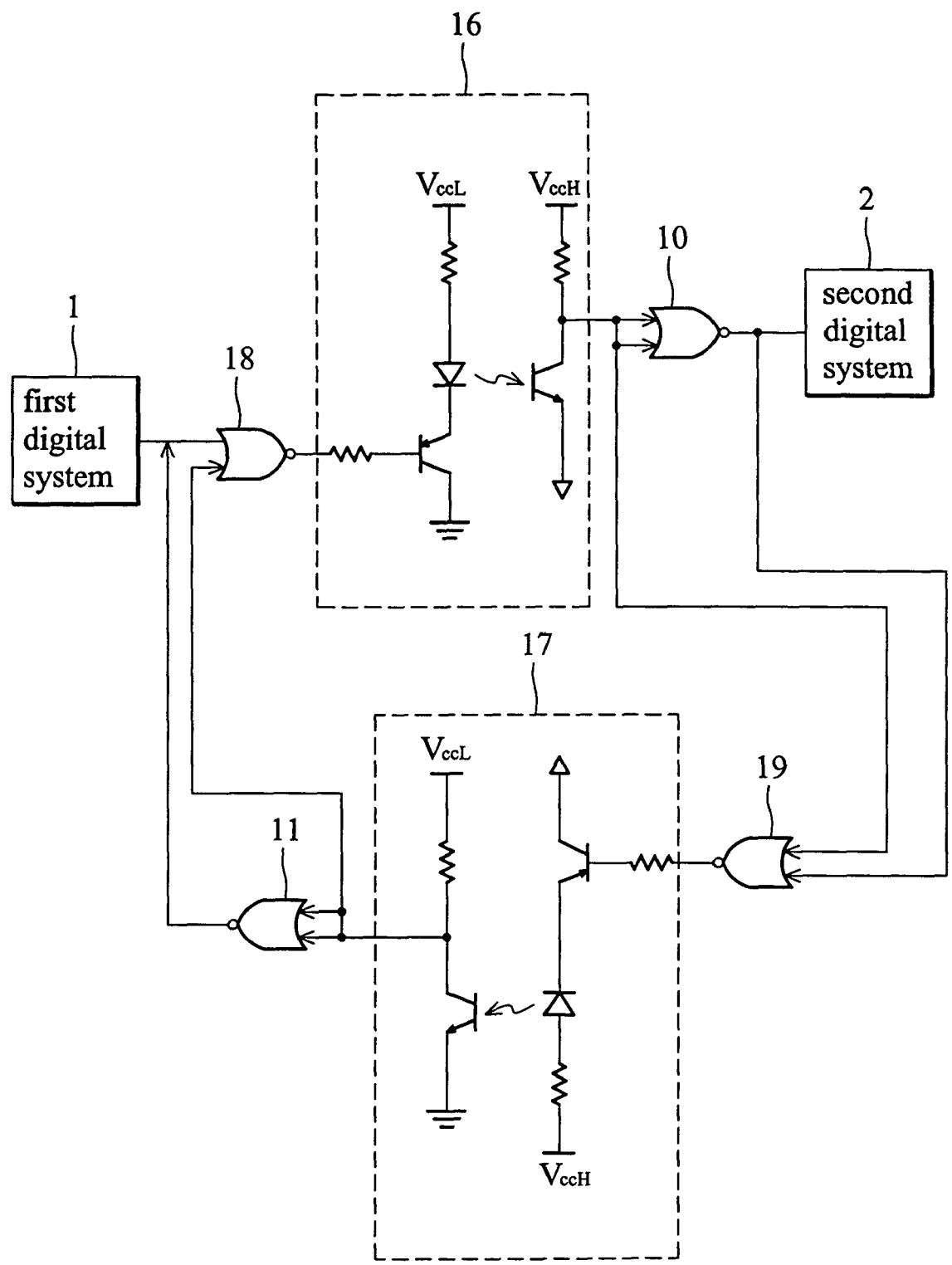
FIG. 9 shows the implementations of the present invention on a prototype circuitry.

According to the above-mentioned illustration, the circuit shown in FIG. 9 is one possible circuit means of providing the circuit shown in FIG. 5, and the circuit shown in FIG. 11 is the other of that.

Figure 12:
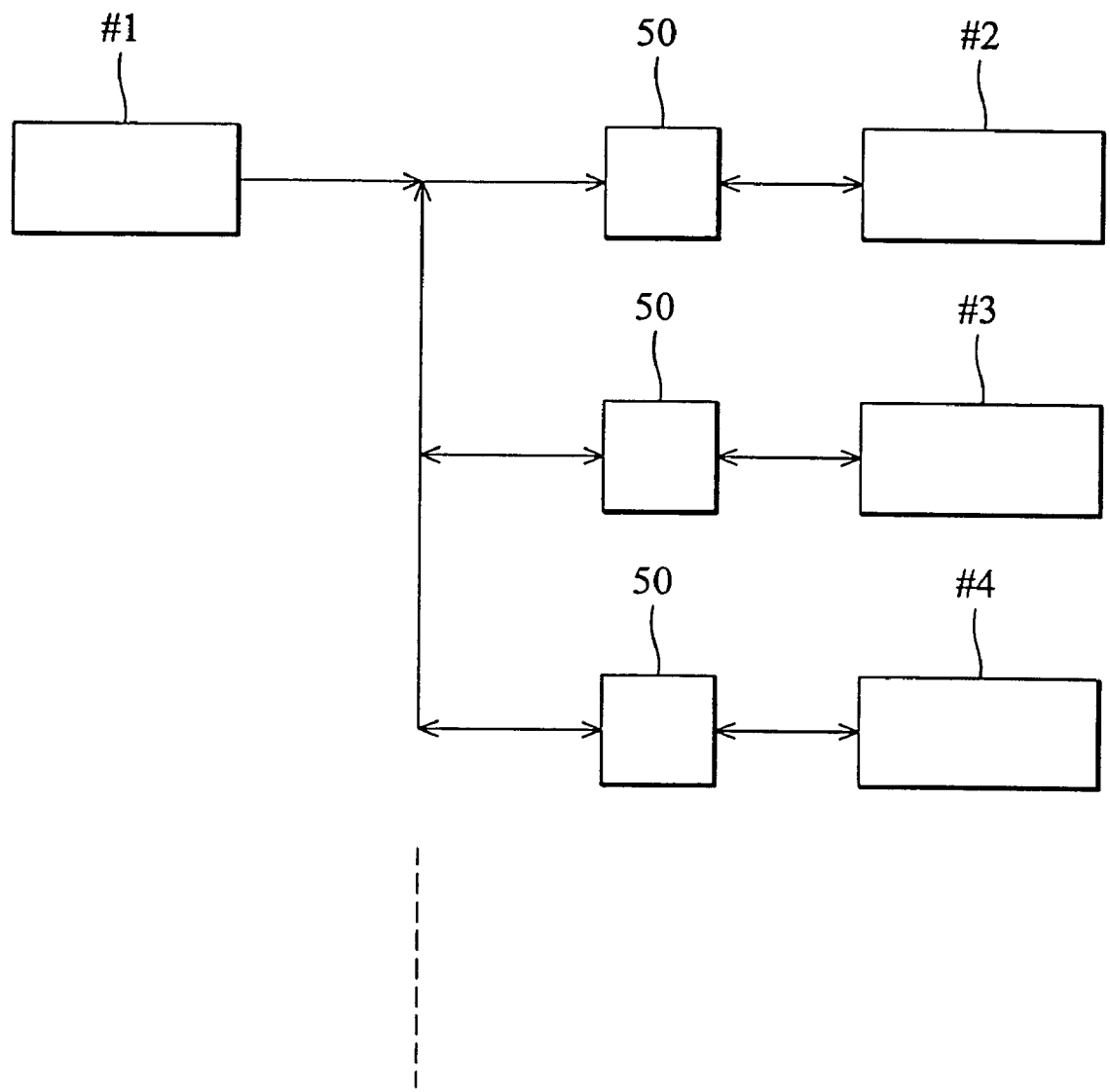
FIG. 12 shows an architecture of the present invention applying multiple digital systems.

The present invention can apply not only two digital transmission/receiver systems of a bi-directional signal line, but also multiple digital transmission/receiver systems (digital system #1~ digital system #n). A structure using the digital signal level converter of the present invention is shown in FIG. 12. The bi-directional transmission between two of the digital systems (#1~#n) is through the common data channel.

When the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A cross-level digital signal transmission device coupled between a first digital system and a second digital system having different ground levels and different voltage levels of high logic level and low logic level, comprising:

a first gateway device having a first signal control terminal for conversion of a logic level of a first signal from the first digital system and transmission to the second digital system;

a second gateway device having a second signal control terminal for conversion of a logic level of a second signal from the second digital system and transmission to the first digital system, wherein the first gateway device and the second gateway device connect in parallel and form a closed loop, the first gateway device controls the second signal control terminal when the first digital system transmits the first signal to prevent the first signal from transmitting to the first digital system by the second gateway device, and the second gateway device controls the first signal control terminal when the second digital system transmits the second signal to prevent the second signal from transmitting to the second digital system by the first gateway device;

wherein the first gateway device comprises:

a first logic level converter having the first signal control terminal for receiving the first signal and converting the logic level of the first signal; and a first delay device coupled between an output terminal of the first logic level converter and the second digital system and having the function of single-way transmission;

wherein the second gateway device comprises:

a second logic level converter, coupled to the output terminal of the first logic level converter, having the second signal control terminal, coupled to the first logic level converter, for receiving the first signal and converting the logic level of the first signal; and a second delay device coupled between an output terminal of the second logic level converter and the first digital system and having the function of single-way transmission; and wherein the first delay device outputs an output signal of the first logic level converter when the output signal of the first logic level converter turns off the second logic level converter by the second signal control terminal, and the second delay device outputs an output signal of the second logic level converter when the output signal of the second logic level converter turns off the first logic level converter by the first signal control terminal.

2. The cross-level digital signal transmission device as claimed in claim 1, wherein the first logic level converter and the second logic level converter are logic level inverters with inverse function having an enable control terminal, and the first delay device and the second delay device are inverters.

3. The cross-level digital signal transmission device as claimed in claim 1, wherein:
the first logic level converter comprises:
a first NOR gate having two input terminals, one input terminal is coupled to the first digital system and the other input terminal serves as the first signal control terminal; and
a first converter, coupled between the first NOR gate and an input terminal of the first delay device, for conversion of a logic level of the first signal; and
the second logic level converter comprises:
a second NOR gate, having two input terminals, whose one input is coupled to the second digital system and the other input serves as the second signal control terminal; and
a second converter, coupled between the second NOR gate and an input terminal of the second delay device, for conversion of a logic level of the second signal.

4. The cross-level digital signal transmission device as claimed in claim 3, wherein:
the first converter comprises:
a first driver circuit coupled to the output terminal of the first NOR gate; and
a first conversion device, an input terminal thereof coupled to an output terminal of the first driver circuit, and the output terminal thereof coupled to an input of the first delay device; and
the second converter comprises:
a second driver circuit coupled to the output terminal of the second NOR gate; and
a second conversion device, an input terminal thereof coupled to an output terminal of the second driver circuit, and the output terminal thereof coupled to an input of the second delay device.

5. The cross-level digital signal transmission device as claimed in claim 4, wherein the first conversion device and the second conversion device comprise photocoupled devices, and the first driver circuit and the second driver circuit comprise switches, respectively.

6. The cross-level digital signal transmission device as claimed in claim 4, wherein the first conversion device and the second conversion device comprise relays, and the first driver circuit and the second driver circuit comprise switches, respectively.

7. The cross-level digital signal transmission device as claimed in claim 3, wherein the first delay device and the second delay device comprise a first inverter and a second inverter.

8. The cross-level digital signal transmission device as claimed in claim 7, wherein the first inverter and the second inverter comprise a third NOR gate and a fourth NOR gate, both having two input terminals tied together.

* * * * *